(12) United States Patent
Lee

(10) Patent No.: US 10,271,536 B2
(45) Date of Patent: Apr. 30, 2019

(54) ELECTRIC SHOCK INSECTICIDAL DEVICE

(71) Applicant: Eung-Do Lee, Daejeon (KR)

(72) Inventor: Eung-Do Lee, Daejeon (KR)

(73) Assignee: Eung-Do Lee, Daejeon (KR)

(*) Notice: Subject to any disclaimer, the term of this patent is extended or adjusted under 35 U.S.C. 154(b) by 316 days.

(21) Appl. No.: 15/308,624

(22) PCT Filed: Jul. 4, 2016

(86) PCT No.: PCT/KR2016/007189
§ 371 (c)(1),
(2) Date: Nov. 3, 2016

(87) PCT Pub. No.: WO2017/034146
PCT Pub. Date: Mar. 2, 2017

(65) Prior Publication Data
US 2017/0188563 A1 Jul. 6, 2017

(30) Foreign Application Priority Data

Aug. 26, 2015 (KR) .................. 10-2015-0120301
Oct. 13, 2015 (KR) .................. 10-2015-0142486
Jun. 8, 2016 (KR) .................. 10-2016-0070971

(51) Int. Cl.
*A01M 1/04* (2006.01)
*A01M 1/10* (2006.01)
(Continued)

(52) U.S. Cl.
CPC .............. *A01M 1/223* (2013.01); *A01M 1/04* (2013.01); *A01M 1/106* (2013.01); *A01M 1/12* (2013.01);
(Continued)

(58) Field of Classification Search
CPC .......... A01M 1/04; A01M 1/22; A01M 1/223; A01M 1/12; A01M 1/106; H05C 1/00;
(Continued)

(56) References Cited

U.S. PATENT DOCUMENTS 6,134,826 A * 10/2000 Mah .................. A01M 1/04
43/112
6,195,932 B1 * 3/2001 Aicher .................. A01M 1/04
43/112

FOREIGN PATENT DOCUMENTS

KR       20-0263719 Y1   2/2002
KR    10-2008-0098276 A   11/2008
(Continued)

OTHER PUBLICATIONS

Machine Translation of Chan-Hyuk Korean Patent Document 10-2008-0107916 Dec. 11, 2008.*
(Continued)

*Primary Examiner* — Kevin J Comber
(74) *Attorney, Agent, or Firm* — Rabin & Berdo, P.C.

(57) ABSTRACT

The present invention provides an electric shock insecticidal device reducing noise and light pollution emitted to an outside. The electric shock insecticidal device converts output voltage and output current supplied to a grid electrode into AC voltage and AC current or into DC voltage and DC current selectively; controls levels of the converted output voltage and current; adjusts an amount of light of the ultraviolet lamp emitted to an outside by using a light blocking layer or an adjusting unit adjusting illumination of an ultraviolet lamp; and easily separates the grid electrode having high voltage from a body unit to remove electrocuted flying insects from the grid electrode.

25 Claims, 14 Drawing Sheets

(51) Int. Cl.
  *A01M 1/12*   (2006.01)
  *A01M 1/22*   (2006.01)
  *G08B 3/10*   (2006.01)
  *H05C 1/00*   (2006.01)
  *H05C 1/02*   (2006.01)
  *H05K 5/00*   (2006.01)
  *H05K 5/02*   (2006.01)
  *F21V 11/00*   (2015.01)
  *F21V 23/04*   (2006.01)
  *F21V 25/00*   (2006.01)
  *H05B 33/08*   (2006.01)
  *H05B 37/02*   (2006.01)
  *F21Y 115/10*  (2016.01)

(52) U.S. Cl.
  CPC ............... *A01M 1/22* (2013.01); *F21V 11/00* (2013.01); *F21V 23/04* (2013.01); *F21V 25/00* (2013.01); *H05B 33/0845* (2013.01); *H05B 37/0272* (2013.01); *H05C 1/00* (2013.01); *H05C 1/02* (2013.01); *H05K 5/0017* (2013.01); *H05K 5/023* (2013.01); *F21Y 2115/10* (2016.08); *G08B 3/10* (2013.01)

(58) Field of Classification Search
  CPC .. H05C 1/02; H05B 37/0272; H05B 33/0845; F21V 11/00; F21V 23/04; F21V 25/00; H05K 5/023; H05K 5/0017; G08B 3/10; F21Y 2115/10

USPC ........................................................ 361/232
  See application file for complete search history.

(56)  References Cited

FOREIGN PATENT DOCUMENTS

| KR | 10-2008-0107916 A | 12/2008 |
| KR | 10-2009-0001400 A | 1/2009 |
| KR | 20-0444855 Y1 | 6/2009 |
| KR | 10-2009-0092970 A | 9/2009 |
| KR | 10-2011-0015233 A | 2/2011 |
| KR | 10-2012-0029689 A | 3/2012 |
| KR | 10-2013-0021762 A | 3/2013 |

OTHER PUBLICATIONS

Machine Translation of Song Korean Patent Document 20-0444855 Jun. 10, 2009.*
Machine Translation of Chan-Hyuk Korean Patent Document 10-2008-0098276 Nov. 7, 2008.*
Machine Translation of Chan-Hyuk Korean Patent Document 10-2009-0001400 Jan. 8, 2009.*
Machine Translation of Gye Korean Patent Document 10-2013-0021762 Mar. 6, 2013.*
Korean Office Action dated Mar. 17, 2016.

* cited by examiner

ELECTRIC SHOCK INSECTICIDAL DEVICE

TECHNICAL FIELD

The present invention relates to an electric shock insecticidal device and, more particularly, to an electric shock insecticidal device reducing light and noise emitted to the outside, and selectively changing intervals of electrodes, thereby properly killing harmful insects on the basis of an installation position and sizes of the insects.

BACKGROUND ART

Generally, due to insects that are harmful to humans or livestock, or that disturb the growth of plants such as crops, fruit trees, grass, etc., the activities of humans or livestock, and the growth of plants are disturbed, especially during the summer. In order to eliminate flying harmful insects, various kinds of insecticidal devices and methods have been developed.

Among various insecticidal devices and methods currently put to practical use there are: chemicals sprayed in smoke or liquid form, an insect collector emitting ultraviolet light that attracts harmful flying insects and traps the harmful insects by sucking them up, a conventional electric shock insecticidal device electrocuting the attracted harmful insects, etc.

In the meantime, a chemical spraying method has a wide range of killing insects, and has immediate effect. However, the chemicals contaminate ambient air, water, food, agricultural and marine products, etc. The insect collector collecting harmful insects by using the ultraviolet light to attract the harmful insects is required to be furnished with collecting equipment, and the harmful insects may be kept in a state where they are not completely killed. Therefore, it is necessary to perform additional eradication steps.

The conventional electric shock insecticidal device electrocuting harmful insects attracted by ultraviolet light does not contaminate ambient air, water, crops in comparison with the chemical spraying method. Unlike the insect collector, the conventional electric shock insecticidal device is not required to perform additional eradication steps, etc.

However, in the process of electrocuting harmful insects, the harmful insects are instantaneously surrounded by an electrically discharged flame while being killed. Even as the harmful insects bounce off a grid electrode of high voltage, high-pitched zapping sound of the harmful insects is produced at the grid electrode. Therefore, the conventional electric shock insecticidal device generates noise pollution. In addition, light pollution is generated in the evening since an ultraviolet lamp emits light to attract harmful insect in a direction of the conventional electric shock insecticidal device.

In addition, it is required to remove the electrocuted harmful insects stuck on the grid electrode of the conventional electric shock insecticidal device. The conventional electric shock insecticidal device uses electricity such that a protective cover is provided to prevent the body of a human from touching the grid electrode. However, it is difficult to remove the dead harmful insects stuck on the grid electrode due to the protective cover. Therefore, it is required to use a tool, such as a brush, which can pass through the protective cover to remove the dead harmful insects stuck on the grid electrode.

In addition, kinds and sizes of harmful insects vary depending on a place of use. When spaces between electrodes are narrow, it is difficult for big harmful insects to come into contact with the electrodes and be electrocuted. When the spaces between the electrodes are wide, small harmful insects may easily escape the electrodes. Therefore, a technology of eradicating various sizes of harmful insects depending on a place of is required.

Korea Utility Model Registration No. 20-0263719 (Registration date: Jan. 28, 2002, title: bug killer by electrical)

DISCLOSURE

Technical Problem

The present invention has been proposed to solve the problems in the related art. The present invention is intended to propose an electric shock insecticidal device reducing light and noise pollution generated by the electric shock insecticidal device, thereby reducing auditory and visual fatigue of a user.

In addition, the present invention is intended to propose the electric shock insecticidal device separating a grid electrode from a body unit to expose the grid electrode to the outside, thereby simplifying cleaning or maintaining of the grid electrode.

In addition, the present invention is intended to propose the electric shock insecticidal device reusing a casing unit by replacing the grid electrode only, in the case of grid electrode faults.

In addition, the present invention is intended to propose the electric shock insecticidal device providing a movable electrode to easily eradicate big or small harmful insects depending on a place and a position of use.

It is to be understood that technical problems to be solved by the present disclosure are not limited to the aforementioned technical problems.

Technical Solution

In order to achieve the above object, according to one aspect of the present invention, there is provided an electric shock insecticidal device including: an ultraviolet lamp; a casing unit having the ultraviolet lamp therein; a grid electrode electrocuting harmful insects attracted through at least one of a front and a rear of the ultraviolet lamp; an adjusting unit converting output voltage and output current supplied to the grid electrode into AC voltage and AC current or into DC voltage and DC current selectively, and controlling illumination of the ultraviolet lamp by controlling levels of the converted output voltage and current; and a light blocking layer adjusting an amount of light of the ultraviolet lamp emitted to an outside so as to block the light.

According to another aspect, there is provided an electric shock insecticidal device including: a casing unit having an ultraviolet lamp therein; an insert body having a grid electrode electrocuting harmful insects attracted thereto, the insert body coupled to the casing unit; an adjusting unit converting output voltage and output current supplied to the grid electrode into AC voltage and AC current or into DC voltage and DC current selectively, and controlling illumination of the ultraviolet lamp by controlling levels of the converted output voltage and current; and a light blocking layer adjusting an amount of light of the ultraviolet lamp emitted to an outside so as to block the light.

The insert body may be inserted through an insert hole provided at a side surface of the casing unit, and may be mounted in the casing unit by connecting an end of the grid electrode to an electrode part of the casing unit.

Specifically, the adjusting unit may include: a converting switch converting the output voltage and the output current supplied to the grid electrode into the AC voltage and the AC current or into the DC voltage and the DC current selectively; and a level adjusting part adjusting levels of intensities of the AC voltage and the AC current supplied to the grid electrode, or adjusting levels of intensities of the DC voltage and the DC current supplied to the grid electrode.

In addition, the adjusting unit may include an illumination adjusting part individually adjusting at least one of the illumination of the ultraviolet lamp and a number of ultraviolet lamps to be turned on.

In addition, the electric shock insecticidal device may include: an opening provided at a lower end portion of the casing unit to discharge the electrocuted harmful insects in a downward direction of the casing unit; and a holding part provided below the opening, and holding a receiving part collecting the electrocuted harmful insects.

In addition, the electric shock insecticidal device may include a display unit displaying a mode of a current state of the grid electrode to the outside.

In addition, the display unit may include at least one of: a sound output part outputting an alarm or music; an LED output part outputting light by being turned on; and an LCD output part outputting letters or an image.

In addition, the electric shock insecticidal device may include an auxiliary power supply unit supplying power to a memory unit storing and maintaining a mode of a current state in a power cut-off state.

In addition, the casing unit may include: a mounting part therein, the mounting part mounting the insert body inserted into the casing part through the insert hole, and the electrode part is provided at a position corresponding to the grid electrode of the insert body.

In addition, the insert body may be integrally provided with a receiving part at a lower end portion of the insert body, the receiving part collecting the harmful insects electrocuted by the grid electrode.

In addition, the insert body may be provided with a handle part at a side surface of the insert body, the handle part allowing the insert body to be easily separated from the casing unit.

In addition, the casing unit may be provided with a fixing part, whereby when the insert body is coupled to the casing unit, the insert body is prevented from being unexpectedly separated from the casing unit.

According to still another aspect, there is provided an electric shock insecticidal device including: a body unit including an ultraviolet lamp bar therein, the ultraviolet lamp bar having ultraviolet lamps; a fixed electrode unit fixed to the body unit, and having electrodes spaced apart from each other at predetermined intervals; and a movable electrode unit provided at a front or a rear of the fixed electrode unit, and having electrodes spaced apart from each other at intervals that are equal to or shorter than the intervals of the electrodes of the fixed electrode unit, wherein the body unit includes an electrode position adjusting part adjusting the intervals between the electrodes of the fixed electrode unit and the electrodes of the movable electrode unit by moving the movable electrode unit in lateral directions of the fixed electrode unit.

According to yet still another aspect, there is provided an electric shock insecticidal device including: a body unit including an ultraviolet lamp bar therein, the ultraviolet lamp bar having ultraviolet lamps; a fixed electrode unit fixed to the body unit, and having electrodes spaced apart from each other at predetermined intervals; and a movable electrode unit provided at a front or a rear of the fixed electrode unit, and having electrodes spaced apart from each other at intervals that are equal to or shorter than the intervals of the electrodes of the fixed electrode unit, wherein the body unit is provided with a mounting slit having two mounting positions, the mounting slit allowing adjustment of the mounting position of the movable electrode unit so as to adjust the intervals between the electrodes of the fixed electrode unit and the electrodes of the movable electrode unit.

Specifically, the ultraviolet lamps may be ultraviolet LED lamps.

In addition, the ultraviolet lamp bar may include: a first lamp part provided at a first surface of the ultraviolet lamp bar, the first lamp part having a plurality of ultraviolet LED lamps spaced apart from each other at predetermined intervals; and a second lamp part provided at a second surface of the ultraviolet lamp bar, the second lamp part having a plurality of ultraviolet LED lamps, wherein a number of the ultraviolet LED lamps of the second lamp part is less than a number of the ultraviolet LED lamps of the first lamp part.

In addition, the ultraviolet lamp bar may include one or more ultraviolet lamp bars, and the ultraviolet lamp bars are individually controlled.

In addition, at least one of the first lamp part and the second lamp part of the ultraviolet lamp bar may be selectively turned on, and the first and second lamp parts may be individually controlled.

In addition, the ultraviolet lamp bar may include an angle adjusting unit rotating the first lamp part and the second lamp part to adjust angles thereof, thereby changing directions thereof.

In addition, voltages and currents applied to the fixed electrode unit and the movable electrode unit may be controlled.

In addition, the electrode position adjusting part may include: a rack provided at a lower end of the movable electrode unit; and a pinion provided below the movable electrode unit and engaged with the rack.

In addition, the electrode position adjusting part may include: a guide provided at at least one of lower and upper ends of an inside of the body unit; and a protrusion provided at at least one of lower and upper ends of the movable electrode unit, and engaged with the guide.

In addition, the guide through which electric power flows may provide electric power to the electrodes of the movable electrode unit via the protrusion.

Advantageous Effects

As described above, the electric shock insecticidal device can reduce zapping sounds, depending on a situation, produced at the grid electrode as the harmful insects bounce off the grid electrode, thereby reducing noise pollution.

In addition, the electric shock insecticidal device can block levels of light of the ultraviolet lamp emitted to the outside, thereby reducing light pollution.

In addition, the electric shock insecticidal device can adjust wasteful illumination of the ultraviolet lamp, thereby reducing power consumption.

In addition, the electric shock insecticidal device can reduce indirect damage such as a decrease in growth rate that is caused by sleep deprivation of the livestock due to both light of the ultraviolet lamp, which is always turned on, and zapping sounds of the harmful insects, when the electric shock insecticidal device is located at a livestock farm in which many harmful insects are present.

In addition, electrocuted harmful insects stuck on the grid electrode of the electric shock insecticidal device can be easily removed, thereby maintaining a clean state.

In addition, the electric shock insecticidal device can avoid a shortened life of the grid electrode that is caused by the electrocuted harmful insects stuck on the grid electrode.

In addition, the electrode of the electric shock insecticidal device, which is a main cause of failures in the electric shock insecticidal device, can be easily replaced when it fails, thereby reducing maintenance costs.

In addition, the electric shock insecticidal device can easily eradicate big and small flying harmful insects depending on a place of use.

In addition, the movable electrode unit of the electric shock insecticidal device can be moved with a simple operation.

BEST MODE

Figure 1:
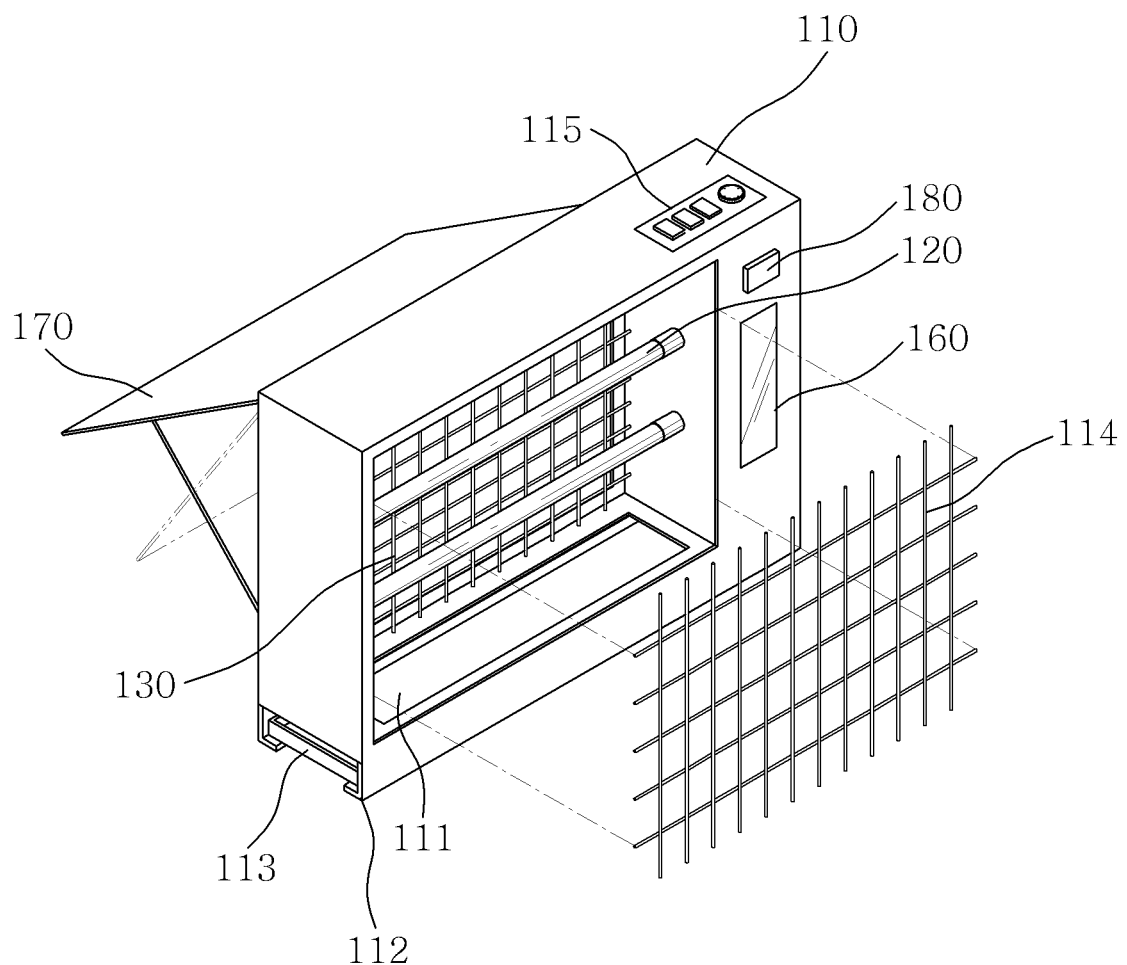
FIG. 1 is a perspective view showing an electric shock insecticidal device according to a first exemplary embodiment of the present invention.

Hereinafter, exemplary embodiments of the present invention will be described in detail with reference to the accompanying drawings. The same reference numerals throughout the drawings denote elements having the same or similar function. In the following description of the present invention, detailed descriptions of known functions and components incorporated herein will be omitted when it may make the subject matter of the present invention unclear.

According to a first exemplary embodiment of the present invention, an electric shock insecticidal device electrocutes harmful insects. More particularly, the electric shock insecticidal device electrocutes harmful insects to provide sanitation, health, and safety without causing inconvenience to a user.

Figure 2:
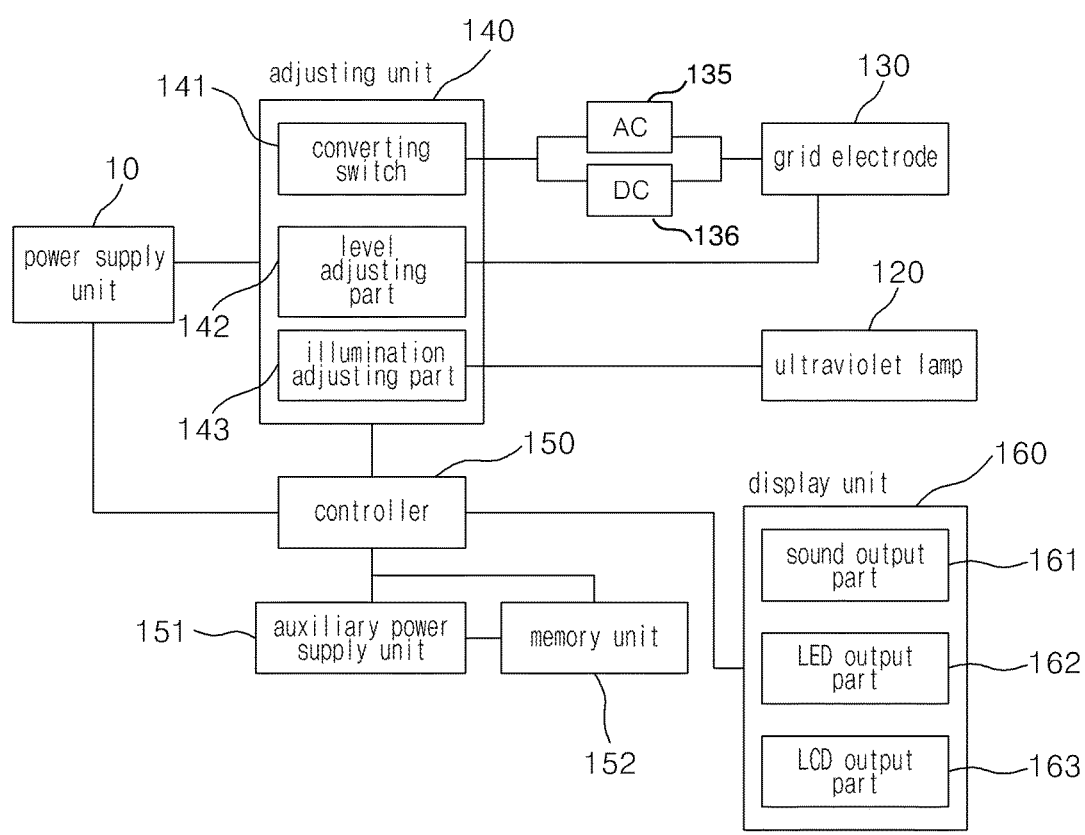
FIG. 2 is a block diagram showing an internal configuration of the electric shock insecticidal device according to the first exemplary embodiment of the present invention.
Figure 3:
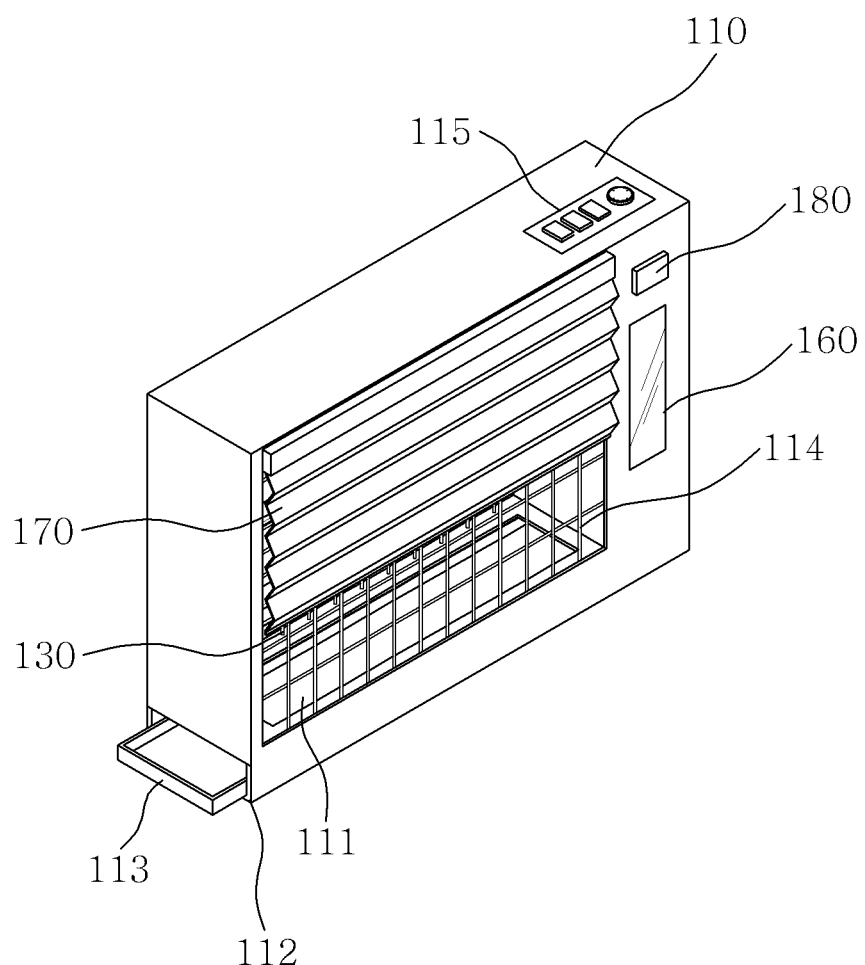
FIGS. 3 to 5 are views respectively showing light blocking layers, which have different shapes, of the electric shock insecticidal device according to the first exemplary embodiment of the present invention.

Referring to FIGS. 1 to 3, the electric shock insecticidal device includes a casing unit 110, an ultraviolet lamp 120, a grid electrode 130, an adjusting unit 140, a controller 150, a display unit 160, and a light blocking layer 170.

The casing unit 110 may have various shapes and sizes depending on its use and location of use. The ultraviolet lamp 120 attracting harmful insects is provided in the casing unit, and the grid electrode 130 is provided in the casing unit. The grid electrode electrocutes the harmful insects attracted through at least one of a front and a rear of the ultraviolet lamp 120.

At the lower end portion of the casing unit 110, an opening 111 is provided to discharge the harmful insects electrocuted by the grid electrode 130 to the outside of the casing unit without leaving the electrocuted harmful insects therein. In addition, a holding part 112 is provided to hold a receiving part 113 collecting the electrocuted harmful insects falling through the opening 111.

Here, the opening 111 is better than a plurality of holes since the opening has a large area through which the electrocuted harmful insects fall, thereby managing the casing unit in a sanitary way.

In addition, harmful insects may enter through the opening 111.

Here, the receiving part 113 slides on the holding part 112 to be coupled thereto, and slides out of the holding part to be separated therefrom, whereby the dead harmful insects collected on the receiving part may be removed.

In addition, the casing unit 110 includes a protective cover 114 positioned at the front of the casing unit so as to prevent a user from touching the grid electrode 130 for user safety.

The ultraviolet lamp 120 is positioned in the casing unit 110, and attracts harmful insects by emitting ultraviolet light which attracts harmful insects. Here, generally, ultraviolet lamps 120 are horizontally or vertically arranged in the casing unit 110 by being spaced apart from each other at predetermined intervals.

In addition, according to the first exemplary embodiment of the present invention, two ultraviolet lamps 120 having the same size are provided. However, the number of the ultraviolet lamps 120 may be equal to or more than two, and two or more ultraviolet lamps 120 may have different thicknesses.

For example, the sizes of even-numbered ultraviolet lamps 120 may be smaller than those of odd-numbered ultraviolet lamps 120. Alternatively, a plurality of ultraviolet lamps 120 and one small ultraviolet lamp 120 may be provided without being limited thereto.

Here, the size of the ultraviolet lamp 120 is proportional to maximum illumination of the light and power consumption.

The grid electrode 130 is provided in the casing unit 110 while being positioned at least one of the front and the rear of the ultraviolet lamp 120. High voltage current is applied to the grid electrode to electrocute harmful insects attracted by the ultraviolet lamp 120.

The adjusting unit 140 converts output voltage and output current supplied to the grid electrode 130 into AC voltage and AC current or into DC voltage and DC current selectively. The adjusting unit controls levels of the converted output voltage and current to control illumination of the ultraviolet lamp 120. It is desirable to control the illumination by using a button part 115 provided on the casing unit 110.

In addition, the adjusting unit 140 may be controlled by receiving instructions of a remote control (not shown) via a remote control receiving unit 180 provided on the casing unit 110.

As shown in FIG. 2, the adjusting unit 140 includes a converting switch 141, a level adjusting part 142, and an illumination adjusting part 143.

The adjusting unit 140 is operated by electric power received from a power supply unit 10.

First, the converting switch 141 converts input voltage and input current into voltage and current that are different from those of the current state. The level adjusting part 142 adjusts levels of voltage and current supplied to the grid electrode 130.

For example, in the current state, when AC voltage and AC current are applied to the grid electrode 130 through an AC power supply (135), AC voltage and AC current are respectively switched into DC voltage and DC current by the converting switch 141. The DC voltage and DC current are supplied to the grid electrode 130 through a DC power supply (136).

The converting switch 141 may be a toggle type switch.

As described above, alternating current and direct current are converted therebetween. While generally used AC current and AC voltage are applied to the grid electrode, in case of requiring a quiet environment on the basis of a situation, the AC current and the AC voltage are converted into proper DC current and DC voltage in order to reduce noise produced at the time of electrocuting harmful insects.

When DC current and DC voltage are applied to the grid electrode, harmful insects approaching the grid electrode 130 are stuck on the grid electrode 130 without noise rather than bouncing off the grid electrode 130. Therefore, the harmful insects are electrocuted by DC voltage and DC current having high voltage applied to both ends of the grid electrode 130.

The harmful insects stuck on the grid electrode rather than scattered are removed by using brush types of cleaning tools. Alternatively, the converting switch 141 converts DC voltage and DC current into AC voltage and AC current repeatedly, or converts AC voltage and AC current into DC voltage and DC current repeatedly, such that the harmful insects stuck on the grid electrode 130 are easily removed from the grid electrode 130 due to changes in electric current types. At this time, zapping sound of the harmful insects being electrocuted is produced. The level adjusting part 142 adjusts voltage and current to control the level of the zapping sound Here, the level adjusting part 142 provided in a dialing type may adjust intensities of voltage and current supplied to the grid electrode 130, and may adjust the intensities by using preset voltage and preset current.

In addition, when eradicating harmful insects by applying DC voltage and DC current to the grid electrode, the harmful insects are eradicated by being stuck on the grid electrode 130 in a quiet environment. When eradicating harmful insects by applying AC voltage and AC current to the grid electrode, the harmful insects bounce off the grid electrode 130 such that noise is produced. However, in this case, the harmful insects are not stuck on the grid electrode 130. Therefore, alternating current and direct current are selectively applied to the grid electrode on the basis of a situation.

The electric shock insecticidal device may include a timer function adjusting the number of times converting DC voltage and DC current into AC voltage and AC current, or AC voltage and AC current into DC voltage and DC current, or adjusting a retention time for converted voltage and current.

In addition, the illumination adjusting part 143 may individually adjust illuminations of the ultraviolet lamps 120.

In order to attract harmful insects in the early evening, it is required to use higher illumination of the ultraviolet lamp 120 than illumination of ambient light such as electric signs. However, it is possible to attract harmful insects with a low illumination of the ultraviolet lamp at night when it is dark, such that wasteful illumination of the ultraviolet lamp 120 may be adjusted.

That is, it is possible to reduce illumination of the ultraviolet lamp by using the illumination adjusting part 143 and thus, it is possible to reduce light pollution caused by the light of the ultraviolet lamp emitted to the outside, thereby relieving user discomfort caused by the light.

In addition, power consumption may be reduced by adjusting illumination of the ultraviolet lamp 120.

The illumination adjusting part 143 may adjust illumination of the ultraviolet lamp 120, or may control a plurality of ultraviolet lamps 120 individually or regularly. That is, some of the ultraviolet lamps 120 may be turned on, and remaining ultraviolet lamps 120 may be turned off.

The controller 150 manages and controls conditions of both the grid electrode 130 and the ultraviolet lamp 120 that are adjusted by the adjusting unit 140, and provides information received from the adjusting unit 140 to the display unit 160.

In addition, the controller 150 provides the information received from the adjusting unit 140 to a memory unit 152. Therefore, even though power of the electric shock insecticidal device is turned off, a mode of the current state is memorized.

Here, the controller 150 monitors the power supply unit 10. When power is cut-off from the power supply unit 10, an auxiliary power supply unit 151 supplies power to the memory unit 152, thereby maintaining information stored in the memory unit.

The display unit 160 displays the mode of the current state of both the grid electrode 130 and the ultraviolet lamp 120 that are adjusted or converted by the adjusting unit 140 to the outside, whereby a user may easily confirm the mode.

Here, the display unit 160 includes at least one of a sound output part 161, an LED output part 162, and an LCD output part 163.

The sound output part 161 outputs an alarm or music, and the LED output part 162 outputs light be being turned on, and the LCD output part 163 outputs letters or an image.

The light blocking layer 170 may be provided at each of the front and the rear of the casing unit 110, and adjust an amount of light of the ultraviolet lamp 120, which is positioned in the casing unit 110, emitted to the outside so as to block the light.

The light blocking layer 170 does not completely block the light of the ultraviolet lamp such that the casing unit has opened portion through which an amount of the light is emitted that is sufficient to attract harmful insect. However, it is required to block the light within a range that a user does not feel discomfort at night when it is dark.

Figure 4:
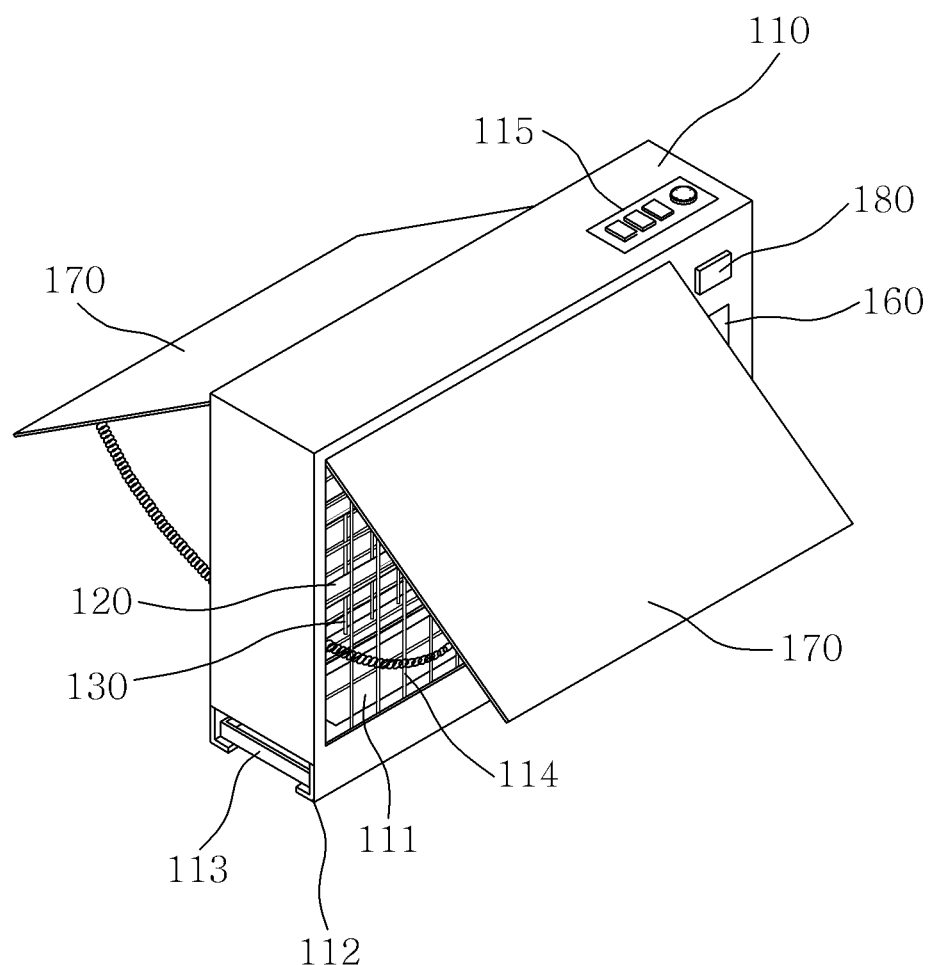
Figure 5:
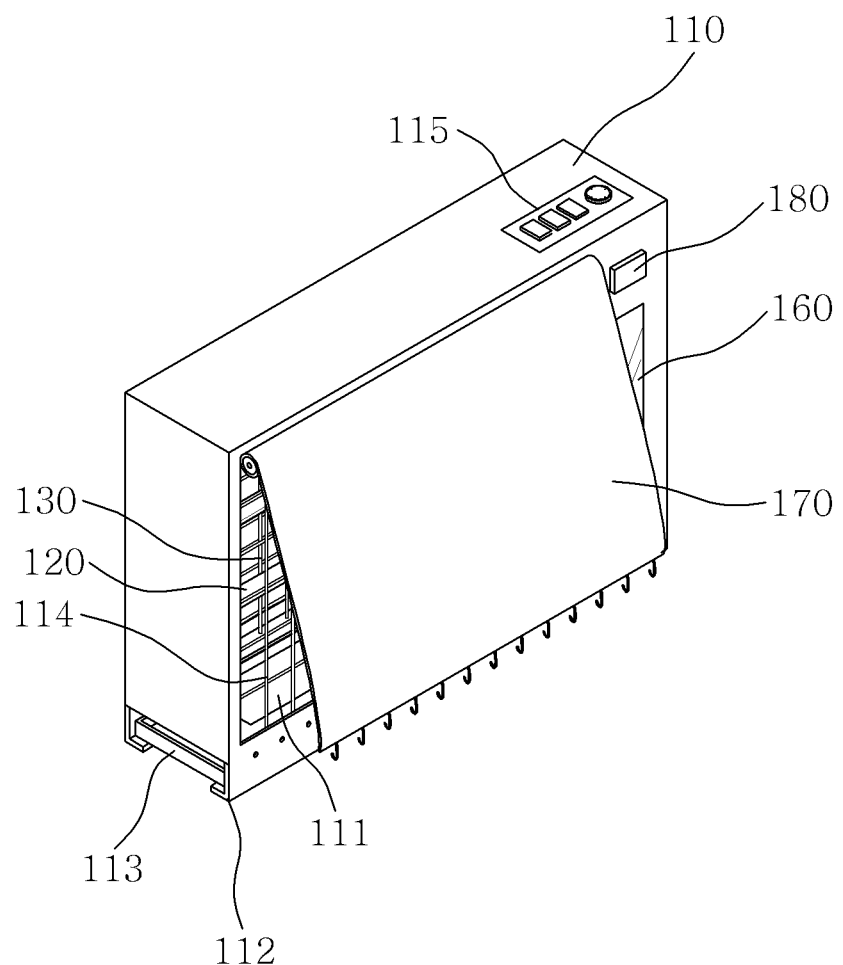
Figure 6:
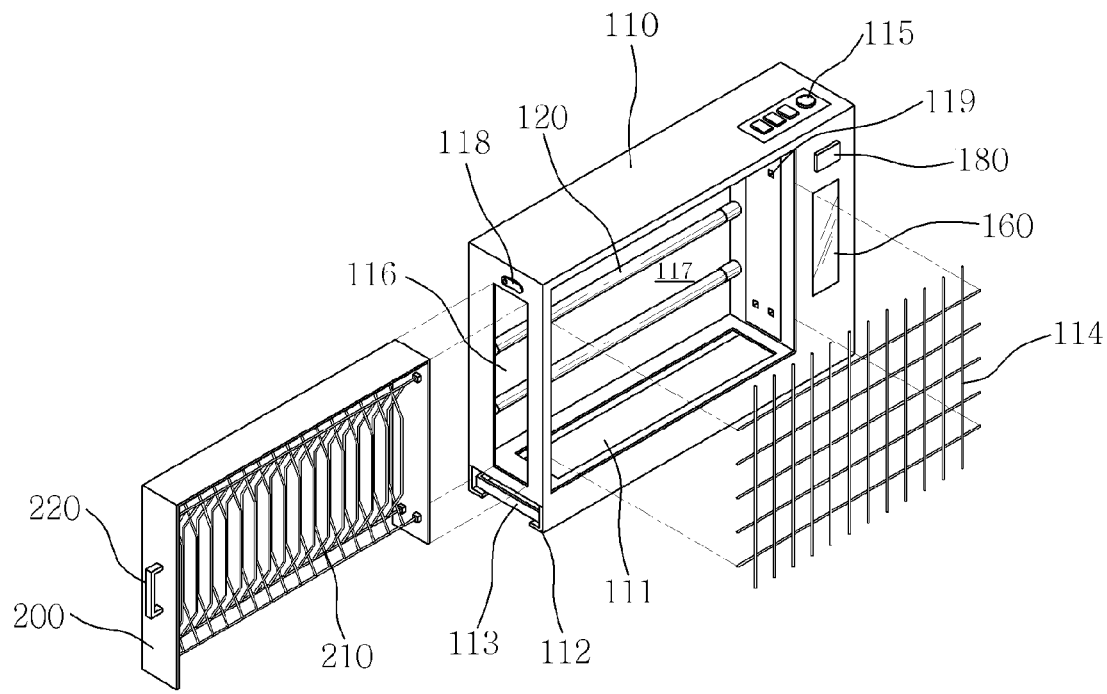
FIG. 6 is a perspective view showing an electric shock insecticidal device according to a second exemplary embodiment of the present invention.

As shown in FIGS. 3 to 5, the light blocking layer 170 may be provided in various shapes.

Referring to FIG. 3, the light blocking layer 170 is provided in a window blind shape at the upper end of the casing unit 110, and has blind slats that are folded and unfolded, such that the amount of the light of the ultraviolet lamp 120 may be reduced. The light blocking layer is partially opened to sufficiently attract harmful insects into the casing unit. Referring to FIG. 4, the light blocking layer is provided at each of the front and the rear of the casing unit 110, and may be opened and closed by an elastic member.

In addition, as shown in FIG. 5, the light blocking layer is provided in a window screen shape at the upper end of the casing unit 110, and is closed by fixing a hook to a predetermined position.

Therefore, the electric shock insecticidal device can reduce zapping sounds, depending on a situation, produced at the grid electrode as the harmful insects bounce off the grid electrode, thereby reducing noise pollution.

In addition, the electric shock insecticidal device can block levels of light of the ultraviolet lamp emitted to the outside, thereby reducing light pollution caused by the light.

In addition, the electric shock insecticidal device can reduce an indirect damage such as a decrease in growth rate that is caused by sleep deprivation of the livestock due to both light of the ultraviolet lamp, which is always turned on, and zapping sound of the harmful insects, when the electric shock insecticidal device is located at a livestock farm in which many harmful insects are present.

According to second and third exemplary embodiments of the present invention, an electric shock insecticidal device electrocutes harmful insects. More particularly, the electric shock insecticidal device enables separation of the grid electrode from a body unit to easily remove the electrocuted harmful insects stuck on the grid electrode, thereby providing convenience to a user.

FIGS. 6 to 9 are views showing respective electric shock insecticidal devices according to second and third exemplary embodiments of the present invention. The electric shock insecticidal device includes a casing unit 110, an adjusting unit 140, a light blocking layer 170, and an insert body 200.

Here, the adjusting unit 140 and the light blocking layer 170 of respective second and third exemplary embodiments are the same as those of the first exemplary embodiment, and thus, detailed descriptions of the adjusting unit and the light blocking layer will be omitted or briefly described in the second and third exemplary embodiments.

The casing unit 110 may be provided in various shapes and sizes depending on uses and places thereof. The ultraviolet lamp 120 attracting harmful insects is provided in the casing unit. An insert hole 116 is provided at a side surface of the casing unit 110 in order to provide the insert body 200 at least one of the front and rear of the ultraviolet lamp 120 in the casing unit.

In addition, lighting (not shown) is provided in the casing unit 110, and it is desirable to individually control the ultraviolet lamp 120 and the lighting.

Here, the ultraviolet lamp 120 is positioned in the casing unit 110, and attracts harmful insects by emitting ultraviolet light which attracts harmful insects. Generally, ultraviolet lamps 120 are horizontally or vertically arranged in the casing unit 110 by being spaced apart from each other at predetermined intervals.

In addition, according to the second and third exemplary embodiments of the present invention, two ultraviolet lamps 120 having the same size are provided. However, the number of the ultraviolet lamps 120 may be one or more, and one or more ultraviolet lamps 120 may have different thicknesses.

For example, the sizes of even-numbered ultraviolet lamps 120 may be smaller than those of odd-numbered ultraviolet lamps 120. Alternatively, a plurality of ultraviolet lamps 120 and one small ultraviolet lamp 120 may be provided without being limited thereto.

Here, the size of the ultraviolet lamp 120 is proportional to maximum illumination of the light and power consumption.

Figure 7:
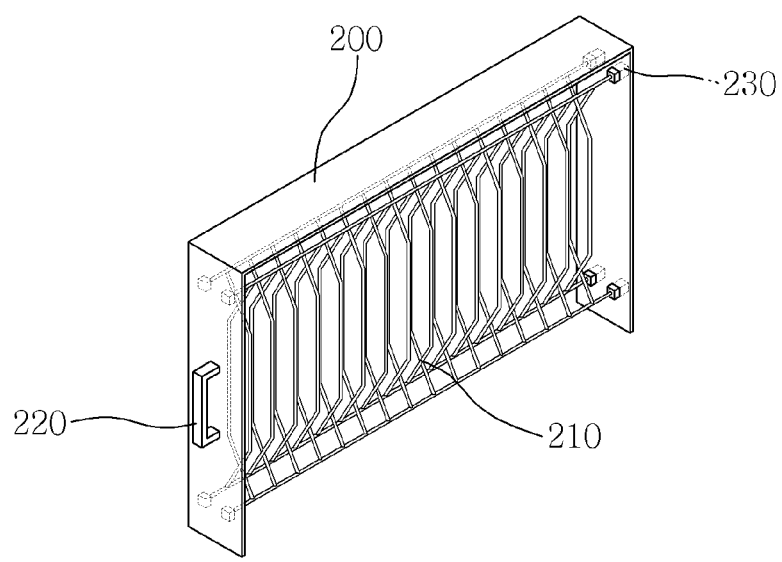
FIG. 7 is a perspective view showing an insert body of the electric shock insecticidal device according to the second exemplary embodiment of the present invention.
Figure 8:
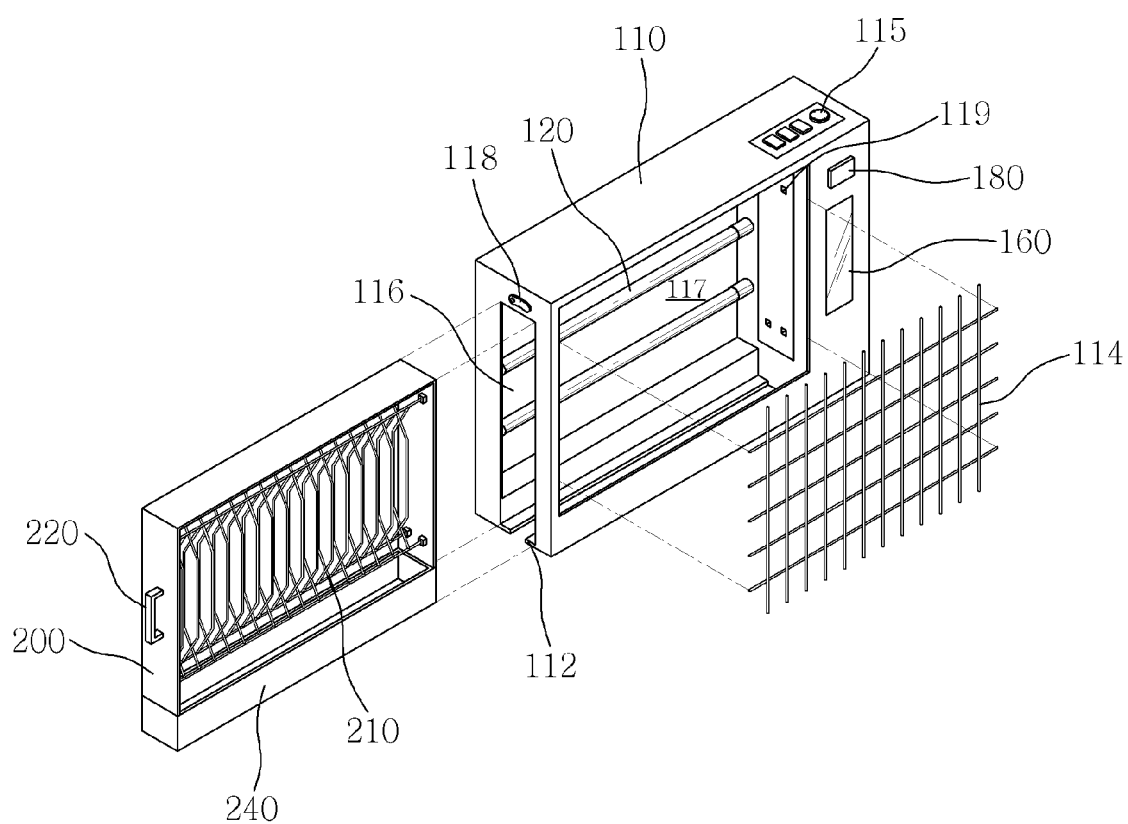
FIG. 8 is a perspective view showing an electric shock insecticidal device according to a third exemplary embodiment of the present invention.

According to the second exemplary embodiment of the present invention, as shown in FIG. 7, the insert body 200 includes a grid electrode 210 electrocuting attracted harmful insects, and the insert body is coupled to the casing unit 110. An end 230 of the grid electrode is provided at a side of the insert body to provide electric power to the grid electrode 210 when the insert body 200 is mounted in the casing unit 110.

The insert body 200 is inserted through the insert hole 116 of the casing unit 110, and is mounted on a mounting part 117 positioned in the casing unit 110. The end 230 of the grid electrode may receive electric power by being connected to an electrode part 119 of the casing unit 110.

In addition, it is desired that a lower portion of the insert body 200 having the grid electrode 210 is provided in an opened shape so as to allow the harmful insects electrocuted by the grid electrode 210 to fall in a downward direction of the casing unit 110.

Here, the insert body 200 may be inserted into the casing unit 110 by being slid.

At the lower end portion of the casing unit 110, an opening 111 is provided to discharge the harmful insects electrocuted by the grid electrode 130 to the outside of the casing unit without leaving the electrocuted harmful insects in the casing unit 110. In addition, a holding part 112 is provided to hold a receiving part 113 collecting the electrocuted harmful insects falling through the opening 111.

Here, the opening 111 is better than a plurality of holes since the opening has a large area through which the electrocuted harmful insects fall, thereby managing the casing unit in a sanitary way.

In addition, harmful insects may enter through the opening 111.

Here, the receiving part 113 slides on the holding part 112 to be coupled thereto, and slides out of the holding part to be separated therefrom, whereby the dead harmful insects collected on the receiving part may be removed.

Figure 9:
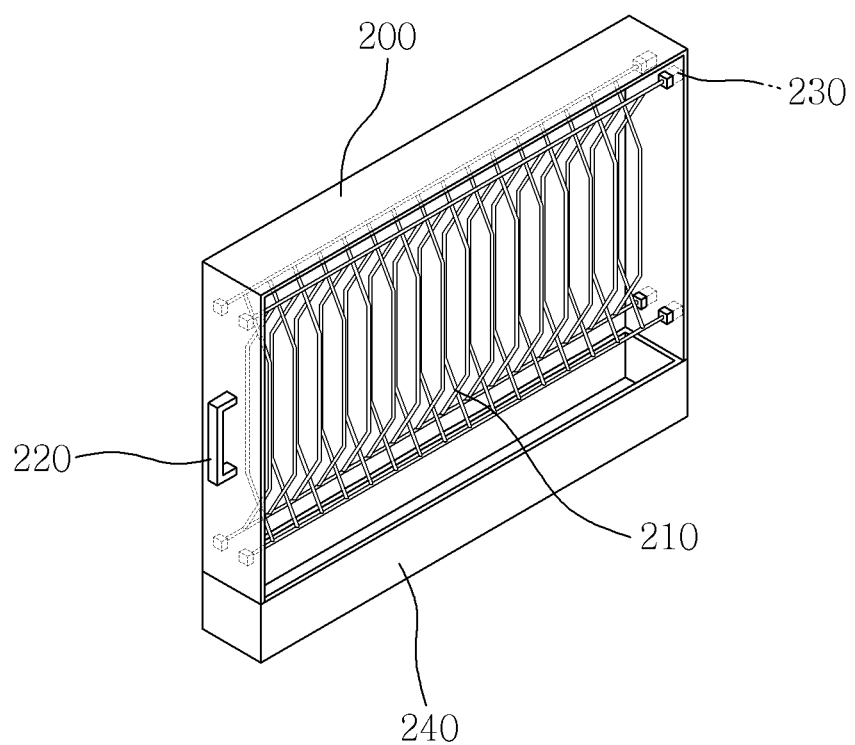
FIG. 9 is a perspective view showing an insert body of the electric shock insecticidal device according to the third exemplary embodiment of the present invention.

According to the third exemplary embodiment of the present invention, as shown in FIG. 9, the insert body 200 includes a grid electrode 210 electrocuting attracted harmful insects, and the insert body is coupled to the casing unit 110. An end 230 of the grid electrode is provided at a side of the insert body to provide electric power to the grid electrode 210, when the insert body 200 is mounted in the casing unit 110. The insert body is integrally provided with a receiving part 240 at a lower end portion of the insert body. The receiving part collects the harmful insects electrocuted by the grid electrode 210.

As described above, when the insert body 200 is integrally provided with the receiving part 240, it is desired that the casing unit 110 is provided with the holding part 112 holding the insert body 200 having the receiving part 240 instead of providing the casing unit with the holding part holding the receiving part 240.

In addition, when the insert body 200 is integrally provided with the receiving part 240, it is unnecessary for the casing unit 110 to provide the opening of the second exemplary embodiment of the present invention.

Not shown in the drawings of the second and third exemplary embodiments of the present invention, the insert body 200 may include an ultraviolet lamp, and the ultraviolet lamp is mounted on or demounted from the casing unit 110 with the grid electrode.

According to the second and third exemplary embodiments of the present invention, a handle part 220 is provided at a side surface of the insert body 200, whereby the insert body 200 is easily separated from casing unit 110. The casing unit 110 is provided with a fixing part 118, whereby when the insert body 200 is coupled to the casing unit, the insert body 200 is prevented from being unexpectedly separated from the casing unit.

The second and third exemplary embodiments of the present invention provide the fixing part 118 positioned around an insert hole 116 of the casing unit, so as to prevent the insert body 200 from being unexpectedly separated from the casing unit, without being limited thereto.

In addition, the casing unit 110 has one or more surfaces opened to the outside for harmful insects to enter the casing unit. The surface through which harmful insects enter is provided with a protective cover 114 to prevent a user from touching the grid electrode 210 for user safety.

The casing unit 110 includes the adjusting unit 140 controlling the ultraviolet lamp 120, the display unit 160, a lighting (not shown), and the grid electrode 210 coupled to the insert body 200.

The adjusting unit 140 converts output voltage and output current supplied to the grid electrode 130 into AC voltage and AC current or into DC voltage and DC current selectively. The adjusting unit controls levels of the converted output voltage and current to control illumination of the ultraviolet lamp 120. It is desirable to control the illumination by using a button part 115 provided on the casing unit 110.

In addition, the adjusting unit 140 may be controlled by receiving commands of a remote control (not shown) through a remote control receiving unit 180 of the casing unit 110. In addition, the adjusting unit may be controlled by receiving commands by using wired or wireless remote signal, and a communication with a smartphone.

As described in the first exemplary embodiment of the present invention, the adjusting unit 140 includes the converting switch 141, the level adjusting part 142, and the illumination adjusting part 143.

The adjusting unit 140 is operated by electric power received from a power supply unit (not shown).

First, the converting switch 141 converts input voltage and input current into voltage and current that are different from those of the current state. The level adjusting part 142 adjusts levels of voltage and current supplied to the grid electrode 130.

For example, in the current state, when AC voltage and AC current are applied to the grid electrode 210 of the insert body, AC voltage and AC current are respectively converted into DC voltage and DC current by the converting switch. The DC voltage and DC current are applied to the grid electrode 210.

The converting switch may be a toggle type switch.

As described above, alternating current and direct current are converted therebetween. While generally used AC current and AC voltage are applied to the grid electrode, in case of requiring a quiet environment on the basis of a situation, the AC current and the AC voltage are converted into proper DC current and DC voltage in order to reduce noise produced at the time of electrocuting harmful insects.

When DC current and DC voltage are applied to the grid electrode 210, harmful insects approaching the grid electrode 210 are stuck on the grid electrode 210 without noise rather than bouncing off the grid electrode 210. Therefore, the harmful insects are electrocuted by DC voltage and DC current having high voltage applied to both ends of the grid electrode 210.

Here, the level adjusting part 142 provided in a dialing type may adjust intensities of voltage and current supplied to the grid electrode 210, and may adjust the intensities by using preset voltage and preset current.

In addition, the illumination adjusting part 143 may individually adjust illuminations of the ultraviolet lamps 120.

In order to attract harmful insects in the early evening, it is required to use higher illumination of the ultraviolet lamp 120 than illumination of ambient light such as electric signs. However, it is possible to attract harmful insects with a low illumination of the ultraviolet lamp 120 at night when it is dark, such that wasteful illumination of the ultraviolet lamp 120 may be adjusted.

That is, it is possible to reduce illumination of the ultraviolet lamp by using the illumination adjusting part 143 and thus, it is possible to reduce light pollution caused by the light of the ultraviolet lamp emitted to the outside, thereby relieving user discomfort caused by the light.

In addition, power consumption may be reduced by adjusting illumination of the ultraviolet lamp 120.

The illumination adjusting part 143 may adjust illumination of the ultraviolet lamp 120, or may control a plurality of ultraviolet lamps 120 individually or regularly.

The controller 150 manages and controls conditions of both the grid electrode 210 and the ultraviolet lamp 120 that are adjusted by the adjusting unit 140, and provides information received from the adjusting unit 140 to the display unit 160.

The display unit 160 displays the mode of the current state of both the grid electrode 210 and the ultraviolet lamp 120 that are adjusted or converted by the adjusting unit 140 to the outside, whereby a user may easily confirm the mode.

Here, the display unit 160 includes at least one of a sound output part 161, an LED output part 162, and an LCD output part 163.

The sound output part 161 outputs an alarm or music, and the LED output part 162 outputs light be being turned on, and the LCD output part 163 outputs letters or an image.

Figure 14:
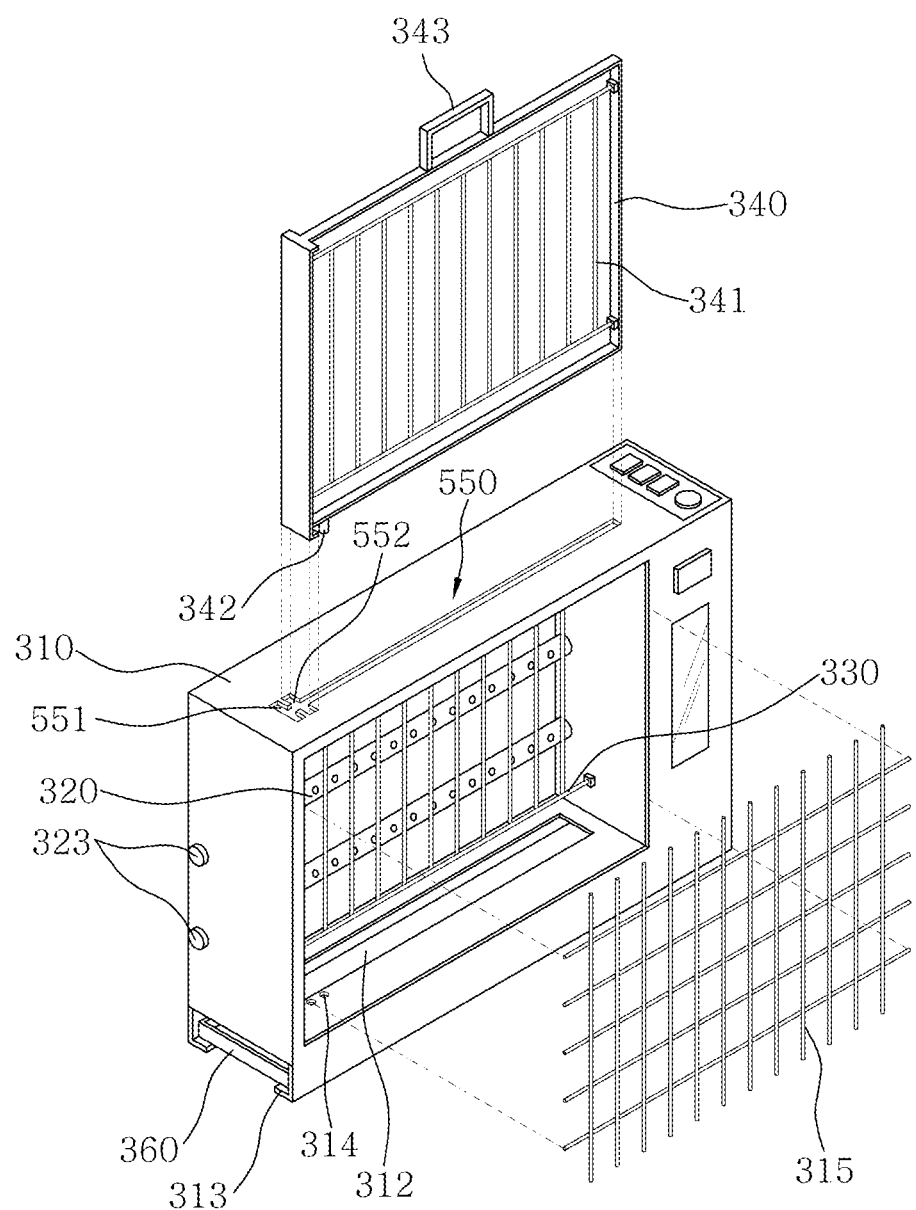
FIG. 14 is a perspective view showing an electric shock insecticidal device according to a sixth exemplary embodiment of the present invention.
Figure 15:
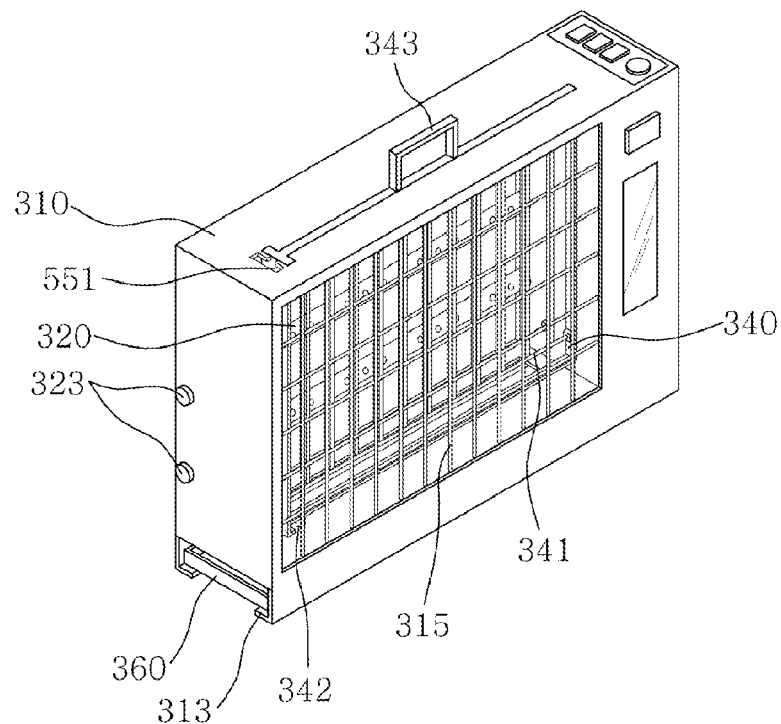
FIG. 15 is a perspective view showing a mounted state of a movable electrode unit of the electric shock insecticidal device according to the sixth exemplary embodiment of the present invention.

FIGS. 10 to 13 are views showing respective electric shock insecticidal devices according to fourth and fifth exemplary embodiments of the present invention. The electric shock insecticidal device includes a body unit 310, an ultraviolet lamp bar 320, a fixed electrode unit 330, a movable electrode unit 340, and an electrode position adjusting part 350. FIGS. 14 to 15 are views showing an electric shock insecticidal device according to a sixth exemplary embodiment of the present invention. The electric shock insecticidal device includes the body unit 310, the ultraviolet lamp bar 320, the fixed electrode unit 330, the movable electrode unit 340, and a mounting slit 550.

According to the fourth and fifth exemplary embodiments of the present invention, the body unit 310 of the electric shock insecticidal device may have various shapes and sizes depending on uses and places thereof. The body unit includes an ultraviolet lamp bar 320 therein to attract harmful insects, a fixed electrode unit 330 provided at least one of the front and rear of the ultraviolet lamp bar 320, the fixed electrode unit having electrodes spaced apart from each other at predetermined intervals, and an insert hole 311 provided at a side surface of the body unit 310 to receive a movable electrode unit 340 in the body unit.

An end insert hole 314 is provided in the body unit 310 to receive an end 342 of the movable electrode unit 340.

An opening 312 is provided at the lower end portion of the body unit 310 to discharge the electrocuted harmful insects by electrodes 331 of the fixed electrode unit 330 and electrodes 341 of the movable electrode unit 340 without leaving the electrocuted harmful insects in the body unit 310. The body unit provides a holding part 313 holding a receiving part 360 collecting the electrocuted harmful insects that have fallen through the opening 312.

The receiving part 360 slides on the holding part to be coupled thereto, and slides out of the holding part to be separated therefrom.

In addition, the body unit 310 has one or more surfaces opened to the outside for harmful insects to enter the casing unit. The surface through which harmful insects enter is provided with a protective cover 315 to prevent a user from touching electrodes 331 of the fixed electrode unit 330 and electrodes 341 of the movable electrode unit 340 for user safety.

At least one ultraviolet lamp bar 320 having an ultraviolet lamp is provided in the body unit 310. When a plurality of ultraviolet lamp bars 320 is provided, the plurality thereof is individually controlled.

The ultraviolet lamp may be an ultraviolet LED lamp. According to the fourth to sixth exemplary embodiments of the present invention, an ultraviolet LED lamp is applied.

A first lamp part 321 is provided at a first surface of the ultraviolet lamp bar 320, and the first lamp part has a plurality of ultraviolet LED lamps spaced apart from each other at predetermined intervals. A second lamp part 322 is provided at a second surface of the ultraviolet lamp bar, and the second lamp part has a plurality of ultraviolet LED lamps, wherein a number of the ultraviolet LED lamps of the second lamp part is less than a number of the ultraviolet LED lamps of the first lamp part 321.

Here, depending on the situation, a user may turn on at least one of the first lamp part 321 and the second lamp part 322 of the ultraviolet lamp bar 320 selectively. The first and second lamp parts 321 and 322 are individually controlled to be turned on and off.

In addition, an angle adjusting unit 323 rotates the first lamp part 321 and the second lamp part 322 to adjust angles thereof, thereby changing directions thereof, and adjusting the illumination of the ultraviolet LED lamp.

For example, when the plurality of ultraviolet lamp bars 320 are provided in the body unit, the plurality of ultraviolet lamp bars may be provided as an upper ultraviolet lamp bar and a lower ultraviolet lamp bar. The first and second lamp parts 321 and 322 of the upper ultraviolet lamp bar 320 and the first and second lamp parts 321 and 322 of the lower ultraviolet lamp bar 320 are individually controlled to be turned on and off (ON/OFF).

In addition, the first lamp parts 321 of the ultraviolet lamp bars 320 or the second lamp parts 322 of the ultraviolet lamp bars 320 may be turned on and off. Alternatively, the first lamp parts 321 and the second lamp parts 322 may be simultaneously turned on and off.

Power consumption may be reduced by using the ultraviolet LED lamp, and the ultraviolet LED lamp is semi-permanently used Here, an angle adjusting unit 323 is provided at the body unit 310 by connecting the ultraviolet lamp bar 320. The ultraviolet lamp bar 320 uses the angle adjusting unit to rotate the first lamp part 321 and the second lamp part 322 to adjust angles thereof, thereby changing directions thereof.

The fixed electrode unit 330 is fixed in the body unit 310, and has electrodes spaced apart from each other at predetermined intervals.

It is desired that the fixed electrode unit 330 is provided at the front or the rear of the ultraviolet lamp bar 320. According to the fourth to sixth exemplary embodiments of the present invention, the fixed electrode unit is provided at the front of the ultraviolet lamp bar.

Figure 10:
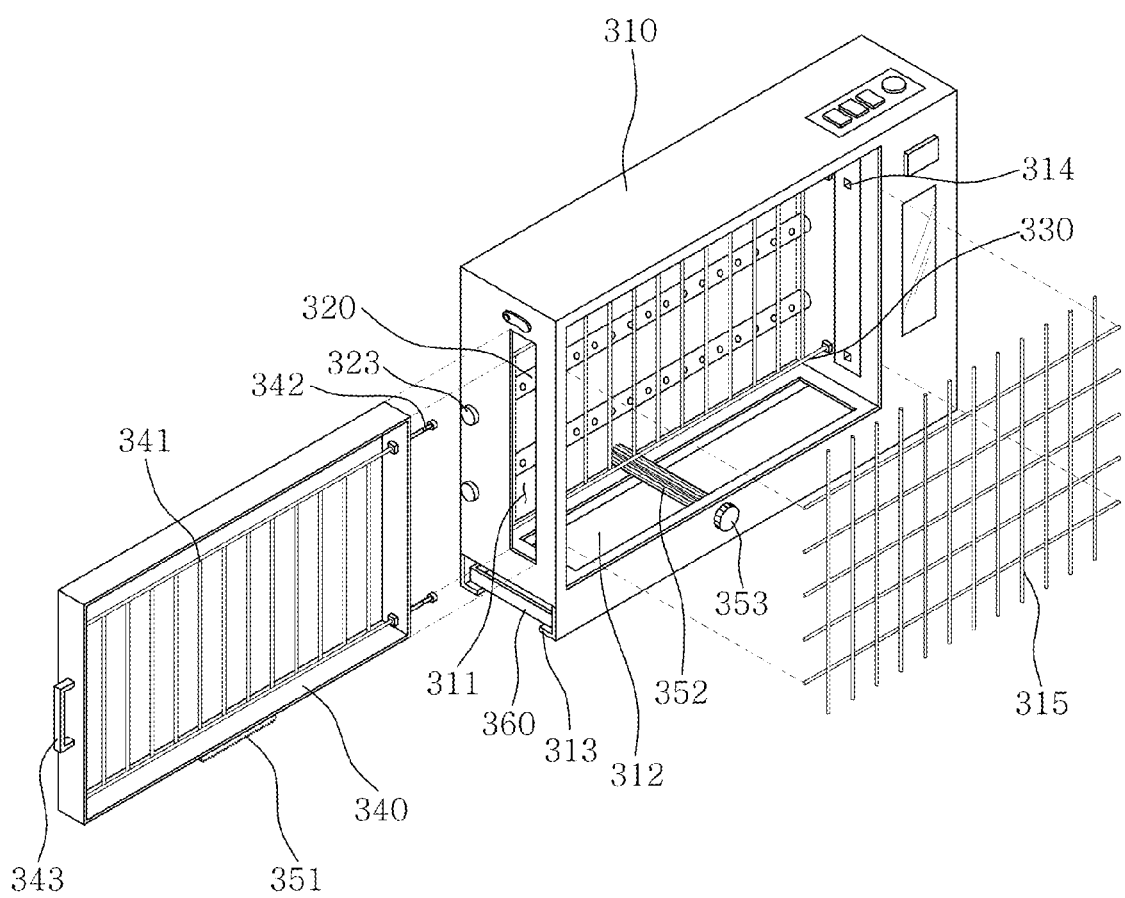
FIG. 10 is a perspective view showing an electric shock insecticidal device according to a fourth exemplary embodiment of the present invention.
Figure 11:
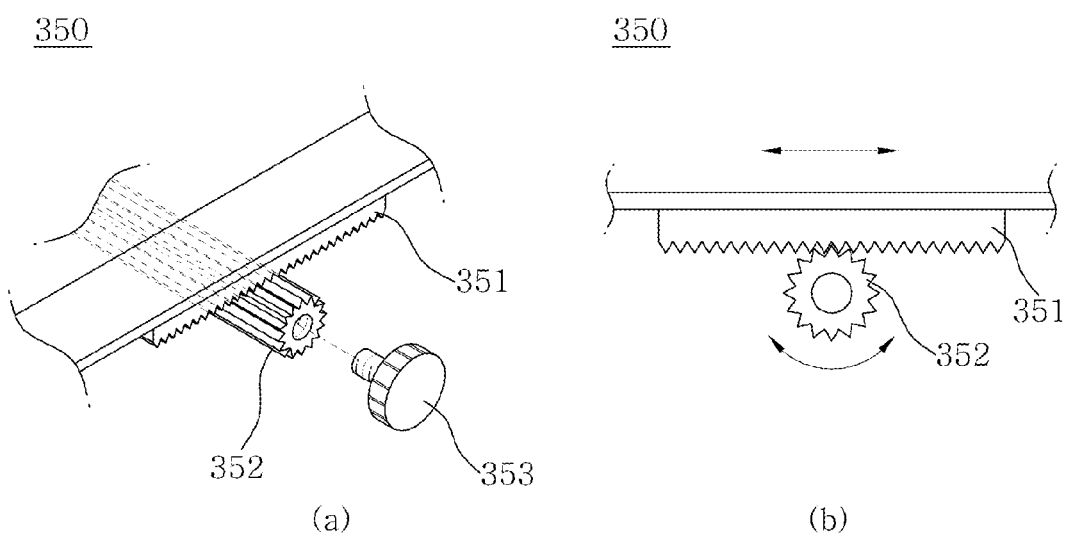
FIG. 11 is a view showing an electrode position adjusting part of the electric shock insecticidal device according to the fourth exemplary embodiment of the present invention.

According to the fourth exemplary embodiment of the present invention shown in FIGS. 10 and 11, the movable electrode unit 340 is close to the fixed electrode unit 330, and has electrodes 341 spaced apart from each other at intervals that are equal to or shorter than the intervals of the electrodes 331 of the fixed electrode unit 330. The intervals between the electrodes 331 of the fixed electrode unit 330 and the electrodes 341 of the movable electrode unit 340 are adjustable.

Here, the movable electrode unit 340 is moved in lateral directions in the body unit 310 such that the intervals of the electrodes of the movable electrode unit may be shorter than the intervals of the electrodes of the fixed electrode unit 330.

The movable electrode unit 340 is inserted in the body unit 310 through the insert hole 311 provided at the side surface of the body unit. An end 342 adjusting its length is provided at an inserted surface of the movable electrode unit such that the electric power is provided to the electrodes 341 of the movable electrode unit 340, when the movable electrode unit is moved in lateral directions. A handle part 343 is provided at the out surface of the movable electrode unit to easily insert the movable electrode unit 340 in the body unit through the insert hole 311.

An adjusting unit (not shown) is provided to adjust voltage and current supplied to the electrodes 331 of the fixed electrode unit 330 and the electrodes 341 of the movable electrode unit 340. The adjusting unit converts output voltage and output current supplied to the electrodes 331 and 341 into AC voltage and AC current or into DC voltage and DC current selectively. The adjusting unit controls levels of the converted output voltage and current. It is desirable to control the levels by using a button part provided on the body unit 310.

In addition, the adjusting unit may be controlled by receiving commands of a remote control (not shown) through a remote control receiving unit (not shown) of the body unit 310. In addition, the adjusting unit may be controlled by receiving commands by using wired or wireless remote signal, and a communication with a smartphone.

The adjusting unit may include a converting switch and a level adjusting part.

The adjusting unit is operated by electric power received from the power supply unit.

The converting switch converts input voltage and input current that are applied to both electrodes 331 of the fixed electrode unit 330 and electrodes 341 of the movable electrode unit 340 into voltage and current that are different from those of the current state. The level adjusting part adjusts levels of voltage and current supplied to the electrodes 331 and 341.

For example, in the current state, when AC voltage and AC current are applied to both the electrodes 331 of the fixed electrode unit 330 and the electrodes 341 of the movable electrode unit 340, the AC voltage and the AC current are respectively converted into DC voltage and DC current by a controller. The DC voltage and DC current are applied to both the electrodes 331 of the fixed electrode unit 330 and the electrodes 341 of the movable electrode unit 340.

As described above, alternating current and direct current are converted therebetween. While AC current and AC voltage, used in general, are applied to the electrodes, in case of requiring a quiet environment on the basis of a situation, the AC current and the AC voltage are converted into proper DC current and DC voltage in order to reduce noise produced at the time of electrocuting harmful insects.

When proper current and voltage are applied to the electrodes 331 of the fixed electrode unit 330 and the electrodes 341 of the movable electrode unit 340, harmful insects approaching the electrodes 331 of the fixed electrode unit 330 and the electrodes 341 of the movable electrode unit 340 are stuck on the electrodes 331 and 341 without noise rather than bouncing off the electrodes 331 and 341. Therefore, the harmful insects are electrocuted by DC voltage and DC current having high voltage applied to both ends of the electrodes 331 and 341.

The electrode position adjusting part 350 assists the movable electrode unit 340 to be moved in lateral directions of the fixed electrode unit 330 to adjust intervals of the electrodes.

A rack 351 is provided at a lower end of the movable electrode unit 340, and a pinion 352 is provided below the movable electrode unit 340 and engaged with the rack 351. The movable electrode unit 340 coupled with the rack 351 is moved in lateral directions by rotating the pinion 352.

Here, the position of the movable electrode unit 340 is adjusted by rotation of the pinion 352 coupled to a pinion rotating part 353, and the position of movable electrode unit 340 is adjusted by pushing or pulling a handle part 343 formed at the out surface of the movable electrode unit 340.

Figure 12:
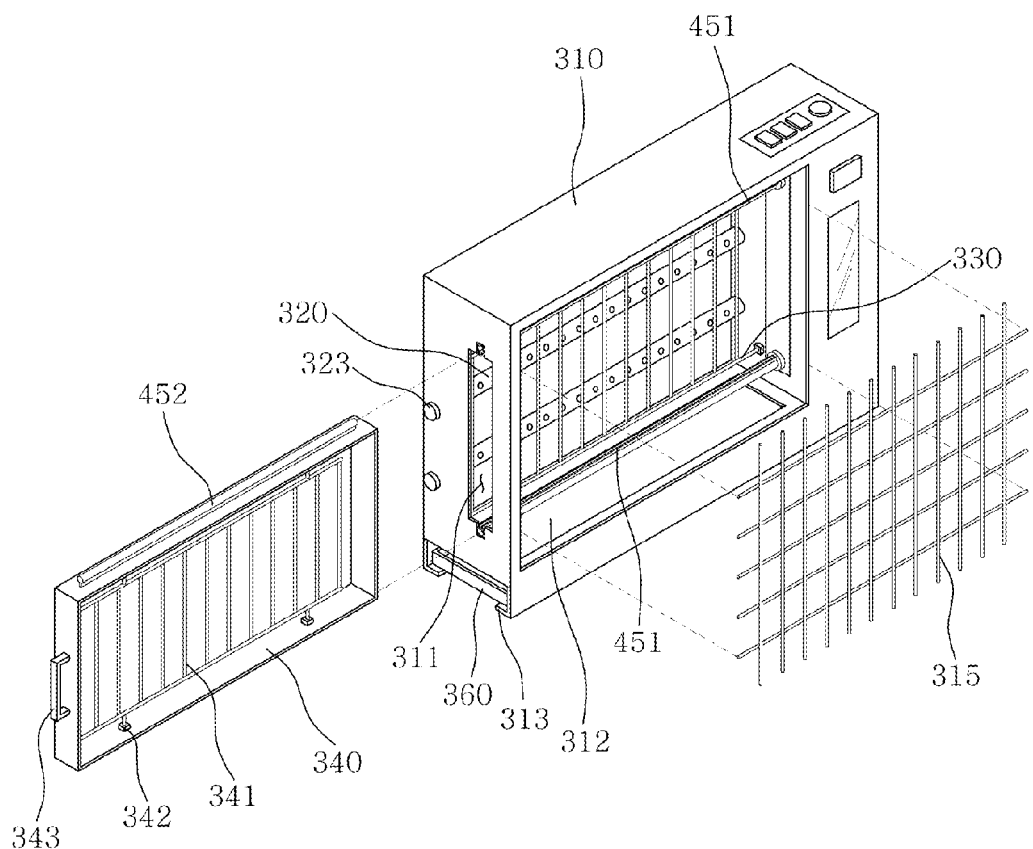
FIG. 12 is a perspective view showing an electric shock insecticidal device according to a fifth exemplary embodiment of the present invention.
Figure 13:
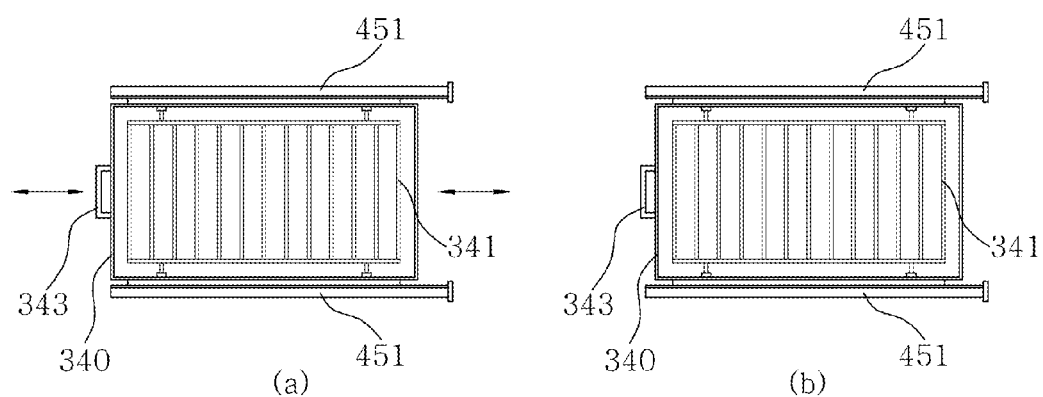
FIG. 13 is a view showing an electrode position adjusting part of the electric shock insecticidal device according to the fifth exemplary embodiment of the present invention.

According to the fifth exemplary embodiment of the present invention shown in FIGS. 12 and 13, the movable electrode unit 340 is close to the fixed electrode unit 330, and has electrodes 341 spaced apart from each other at intervals that are equal to or shorter than the intervals of the electrodes 331 of the fixed electrode unit 330. The intervals between the electrodes 331 of the fixed electrode unit 330 and the electrodes 341 of the movable electrode unit 340 are adjusted.

Here, the movable electrode unit 340 is moved in lateral directions in the body unit 310 such that the intervals of the electrodes of the movable electrode unit may be shorter than the intervals of the electrodes of the fixed electrode unit 330.

The movable electrode unit 340 is inserted in the body unit 310 through the insert hole 311 provided at the side surface of the body unit. A handle part 343 is provided at the out surface of the movable electrode unit to easily insert the movable electrode unit 340 in the body unit.

The electrode position adjusting part assists the movable electrode unit 340 to be moved in lateral directions of the fixed electrode unit 330 to adjust intervals of the electrodes.

According to the fifth exemplary embodiment of the present invention, the electrode position adjusting part includes a guide 451 and a protrusion 452.

According to the fifth exemplary embodiment of the present invention, the electrode position adjusting part includes the guide 451 provided at at least one of lower and upper ends of the insert hole 311 of the body unit 310, and the protrusion 452 provided at at least one of lower and upper ends of the movable electrode unit 340 to be engaged with the guide 451. The movable electrode unit 340 slides into the body unit 310, and the position of movable electrode unit are adjusted by pushing or pulling a handle part 343 formed at the out surface of the movable electrode unit 340.

Electric power flows through the guide 451, and also flows through the end 342 of the movable electrode unit 340 and the protrusion 452. The electric power is provided to the end 342 and the electrodes 341 of the movable electrode unit 340 via the protrusion 452 engaged with the guide 451.

Voltages and currents applied to the electrodes 331 of the fixed electrode unit 330 and the electrodes 341 of the movable electrode unit 340 may be controlled.

According to the fourth and fifth exemplary embodiments of the present invention, the electrode position adjusting part is manually operated, but it is desirable to automatically adjust positions of the electrodes by using a motor.

According to the sixth exemplary of the present invention shown in FIGS. 14 and 15, in the electric shock insecticidal device including the movable electrode unit, the body unit 310 may have various shapes and sizes depending on uses and places thereof. The body unit includes the ultraviolet lamp bar 320 attracting harmful insects therein, the fixed electrode unit 330 provided at least one of the front and rear of the ultraviolet lamp bar 320, the fixed electrode unit having electrodes spaced apart from each other at predetermined intervals, and the mounting slit 550 provided at the upper surface of the body unit 310 to receive the movable electrode unit 340.

The mounting slit 550 will be described in the following.

An opening 312 is provided at the lower end portion of the body unit 310 to discharge the electrocuted harmful insects by electrodes 331 of the fixed electrode unit 330 and electrodes 341 of the movable electrode unit 340 without leaving the electrocuted harmful insects in the body unit 310. The body unit provides a holding part 313 holding a receiving part 360 collecting the electrocuted harmful insects that have fallen through the opening 312.

The receiving part 360 slides on the holding part to be coupled thereto, and slides out of the holding part to be separated therefrom.

In addition, the body unit 310 has one or more surfaces opened to the outside for harmful insects to enter the casing unit. The surface through which harmful insects enter is provided with a protective cover 315 to prevent a user from touching electrodes 331 of the fixed electrode unit 330 and electrodes 341 of the movable electrode unit 340 for user safety.

At least one ultraviolet lamp bar 320 having an ultraviolet lamp is provided in the body unit 310. When a plurality of ultraviolet lamp bars 320 is provided, the plurality thereof is individually controlled.

The ultraviolet lamp may be an ultraviolet LED lamp. According to the fourth to sixth exemplary embodiments of the present invention, an ultraviolet LED lamp is applied.

A first lamp part 321 is provided at a first surface of the ultraviolet lamp bar 320, and the first lamp part has a plurality of ultraviolet LED lamps spaced apart from each other at predetermined intervals. A second lamp part 322 is provided at a second surface of the ultraviolet lamp bar, and the second lamp part has a plurality of ultraviolet LED lamps, wherein a number of the ultraviolet LED lamps of the second lamp part is less than a number of the ultraviolet LED lamps of the first lamp part 321.

Here, depending on the situation, a user may turn on at least one of the first lamp part 321 and the second lamp part 322 of the ultraviolet lamp bar 320 selectively. The first and second lamp parts 321 and 322 are individually controlled to be turned on and off.

In addition, an angle adjusting unit 323 rotates the first lamp part 321 and the second lamp part 322 to adjust angles thereof, thereby changing directions thereof, and adjusting the illumination of the ultraviolet LED lamp.

Power consumption may be reduced by using the ultraviolet LED lamp, and the ultraviolet LED lamp may be semi-permanently used.

Here, an angle adjusting unit 323 is provided at the body unit 310 by connecting the ultraviolet lamp bar 320. The ultraviolet lamp bar 320 uses the angle adjusting unit to rotate the first lamp part 321 and the second lamp part 322 to adjust angles thereof, thereby changing directions thereof.

The fixed electrode unit 330 is fixed in the body unit 310, and has electrodes 331 spaced apart from each other at predetermined intervals. It is desired that the fixed electrode unit 330 is provided at the front or the rear of the ultraviolet lamp bar 320. According to the fourth to sixth exemplary embodiments of the present invention, the fixed electrode unit is provided at the front of the ultraviolet lamp bar.

In order to insert the movable electrode unit 340 in the body unit through a mounting slit 550 provided on an upper surface of the body unit 310, the cross section of the movable electrode unit is the same as the mounting slit 550. A handle part 343 is provided at an upper surface of the movable electrode unit 340 to easily insert the movable electrode unit in the body unit through the mounting slit 550.

Figure 16:
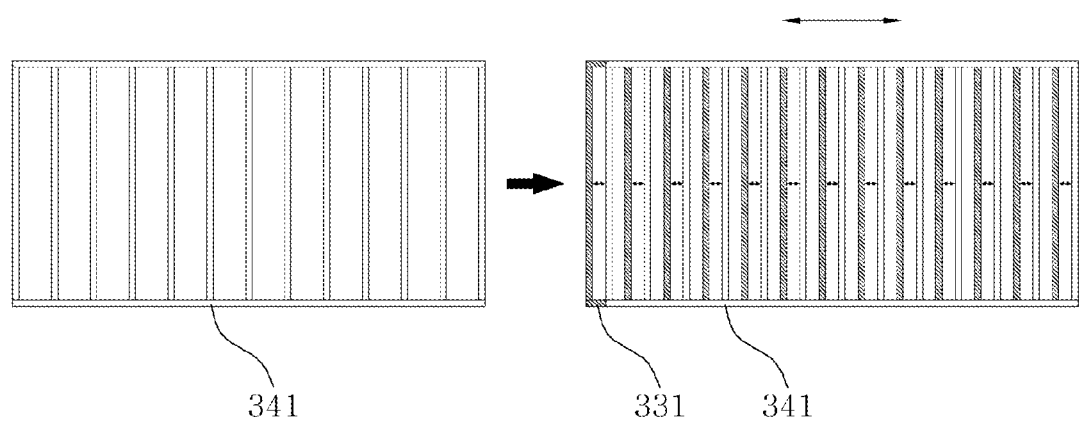
FIG. 16 is a view showing movement of the movable electrode unit of the electric shock insecticidal device according to the fourth to sixth exemplary embodiments of the present invention.
Figure 17:
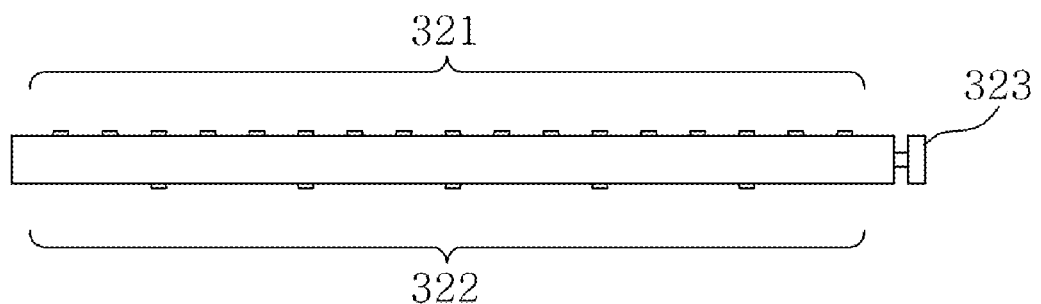
FIG. 17 is a top plan view showing an ultraviolet lamp bar of the electric shock insecticidal device according to the fourth to sixth exemplary embodiments of the present invention.

Here, the mounting slit 550 has two mounting positions. When the movable electrode unit 340 is inserted through a first mounting position 551, the intervals of the electrodes of the movable electrode unit are equal to the intervals of the electrodes 331 of the fixed electrode unit 330, thereby having wide intervals between the electrodes. When the movable electrode unit 340 is inserted through a second mounting position 552, as shown in FIG. 16, the electrodes 331 of the fixed unit 330 are respectively positioned between the electrodes 341 of the movable electrode unit 340, thereby having narrow intervals between the electrodes in comparison with being inserted through the first mounting position 551.

The lower end of the movable electrode unit 340 is provided with the end 342 coupled to the electrodes of the movable electrode unit. In order to couple the end 342 to the body unit 310 for the mounting positions of the mounting slit 550, end insert holes 314 are provided corresponding to the mounting positions of the movable electrode unit 340.

An adjusting unit (not shown) is provided to adjust voltage and current supplied to the electrodes 331 of the fixed electrode unit 330 and the electrodes 341 of the movable electrode unit 340. The adjusting unit converts output voltage and output current supplied to the electrodes 331 and 341 into AC voltage and AC current or into DC voltage and DC current selectively. The adjusting unit controls levels of the converted output voltage and current. It is desirable to control the levels by using a button part provided on the body unit 310.

In addition, the adjusting unit may be controlled by receiving commands of a remote control (not shown) through a remote control receiving unit (not shown) of the body unit 310. In addition, the adjusting unit may be controlled by receiving commands by using wired or wireless remote signal, and a communication with a smartphone.

The adjusting unit may include a converting switch and a level adjusting part.

The adjusting unit is operated by electric power received from the power supply unit.

The converting switch converts input voltage and input current that are applied to both electrodes 331 of the fixed electrode unit 330 and electrodes 341 of the movable electrode unit 340 into voltage and current that are different from those of the current state. The level adjusting part adjusts levels of voltage and current supplied to the electrodes 331 and 341.

For example, in the current state, when AC voltage and AC current are applied to both the electrodes 331 of the fixed electrode unit 330 and the electrodes 341 of the movable electrode unit 340, the AC voltage and the AC current are respectively converted into DC voltage and DC current by a controller. The DC voltage and DC current are applied to both the electrodes 331 of the fixed electrode unit 330 and the electrodes 341 of the movable electrode unit 340.

As described above, alternating current and direct current are converted therebetween. While generally used AC current and AC voltage are applied to the electrodes, in case of requiring a quiet environment on the basis of a situation, the AC current and the AC voltage are converted into proper DC current and DC voltage in order to reduce noise produced at the time of electrocuting harmful insects.

When DC current and DC voltage are applied to both the electrodes 331 of the fixed electrode unit 330 and the electrodes 341 of the movable electrode unit 340, harmful insects approaching both the electrodes 331 of the fixed electrode unit 330 and the electrodes 341 of the movable electrode unit 340 are stuck on the electrodes 331 and 341 without noise rather than bouncing off the electrodes 331 and 341. Therefore, the harmful insects are electrocuted by DC voltage and DC current having high voltage applied to the electrodes 331 and 341.

Accordingly, electrocuted harmful insects stuck on the grid electrode of the electric shock insecticidal device may be easily removed, thereby maintaining a clean state.

In addition, the electric shock insecticidal device may avoid a shortened life of the grid electrode that is caused by the electrocuted harmful insects stuck on the grid electrode.

In addition, the grid electrode of the electric shock insecticidal device may be easily replaced when it fails, thereby reducing maintenance costs.

In addition, the electric shock insecticidal device may easily eradicate big and small flying harmful insects depending on a place of use.

In addition, the electrode unit of the electric shock insecticidal device may be moved with a simple operation.

In addition, the illumination of the light of the electric shock insecticidal device may be easily adjusted depending on a situation. Configurations and operations of the above-described electric shock insecticidal device are not limited to those of the exemplary embodiments of the present invention. Although the preferred embodiments of the present invention have been disclosed for illustrative purposes, those skilled in the art will appreciate that various modifications, additions and substitutions are possible, without departing from the scope and spirit of the invention as disclosed in the accompanying claims.

| Description of main reference numerals of drawings | |
|---|---|
| 110: | casing unit |
| 111: | opening |
| 112: | holding part |
| 113, 240: | receiving part |
| 114: | protective cover |
| 115: | button part |
| 116: | insert hole |
| 117: | mounting part |
| 118: | fixing part |
| 119: | electrode part |
| 120: | ultraviolet lamp |
| 130, 210: | grid electrode |
| 140: | adjusting unit |
| 141: | converting switch |
| 142: | level adjusting part |
| 143: | illumination adjusting part |
| 150: | controller |
| 151: | auxiliary power supply unit |
| 152: | memory unit |
| 160: | display unit |
| 161: | sound output part |
| 162: | LED output part |
| 163: | LCD output part |
| 170: | light blocking layer |
| 180: | remote control receiving unit |
| 200: | insert body |
| 220: | handle part |
| 230: | end of grid electrode |
| 310: | body unit |
| 311: | insert hole |
| 312: | opening |
| 313: | holding part |
| 314: | end insert hole |
| 315: | protective cover |
| 320: | ultraviolet lamp bar |
| 321: | first lamp part |
| 322: | second lamp part |
| 323: | angle adjusting unit |
| 330: | fixed electrode unit |
| 331: | electrode |
| 340: | movable electrode unit |
| 341: | electrode |
| 342: | end |
| 343: | handle part |
| 350: | electrode position adjusting part |
| 351: | rack |
| 352: | pinion |
| 353: | pinion rotating part |
| 360: | receiving part |
| 451: | guide |
| 452: | protrusion |
| 550: | mounting slit |
| 551: | first mounting position |
| 552: | second mounting position |

What is claimed is:

1. An electric shock insecticidal device comprising:
a casing;
an ultraviolet lamp disposed in the casing;
a grid electrode disposed at at least one of a front and a rear of the ultraviolet lamp and electrocuting harmful insects attracted thereto;
an alternating current (AC) power supply connected between a power supply unit and the grid electrode for supplying AC power to the grid electrode;
a direct current (DC) power supply connected between the power supply unit and the grid electrode in parallel with the AC power supply for supplying DC power to the grid electrode;
an adjusting unit including
a converting switch switching an input power of the grid electrode from the AC power to the DC power or from the DC power to the AC power by activating one of the AC power supply and the DC power supply, and
a level adjusting part adjusting levels of intensities of the input power of the grid electrode; and
a light blocking layer adjusting an amount of light of the ultraviolet lamp emitted to an outside so as to block the light.

2. The device of claim 1, wherein the adjusting unit further comprises an illumination adjusting part individually adjusting at least one of the illumination of the ultraviolet lamp and a number of ultraviolet lamps to be turned on.

3. The device of claim 1, further comprising:
an opening provided at a lower end portion of the casing to discharge the electrocuted harmful insects in a downward direction of the casing; and
a holding part provided below the opening, and holding a receiving part collecting the electrocuted harmful insects.

4. The device of claim 1, further comprising:
a display unit displaying a mode of a current state of the grid electrode to the outside.

5. The device of claim 4, wherein the display unit comprises at least one of:
a sound output part outputting an alarm or music;
an LED output part outputting light by being turned on; and
an LCD output part outputting letters or an image.

6. An electric shock insecticidal device comprising:
a casing;
an ultraviolet lamp disposed in the casing;
an insert body including a grid electrode electrocuting harmful insects attracted thereto, the insert body coupled to the casing;
an alternating current (AC) power supply connected between a power supply unit and the grid electrode for supplying AC power to the grid electrode;
a direct current (DC) power supply connected between the power supply unit and the grid electrode in parallel with the AC power supply for supplying DC power to the grid electrode;
an adjusting unit including
a converting switch switching an input power of the grid electrode from the AC power to the DC power or from the DC power to the AC power by activating one of the AC power supply and the DC power supply, and
a level adjusting part adjusting levels of intensities of the input power of the grid electrode; and
a light blocking layer adjusting an amount of light of the ultraviolet lamp emitted to an outside so as to block the light,
wherein the insert body is inserted through an insert hole provided at a side surface of the casing, and is mounted in the casing by connecting an end of the grid electrode to an electrode part of the casing.

7. The device of claim 6, wherein the casing includes a mounting part therein, the mounting part mounting the insert body inserted into the casing through the insert hole, and
the electrode part is provided at a position corresponding to the grid electrode of the insert body.

8. The device of claim 6, wherein the insert body is integrally provided with a receiving part at a lower end portion of the insert body, the receiving part collecting the harmful insect electrocuted by the grid electrode.

9. The device of claim 6, wherein the insert body is provided with a handle part at a side surface of the insert body, the handle part allowing the insert body to be easily separated from the casing.

10. The device of claim 6, wherein the casing is provided with a fixing part, whereby when the insert body is coupled to the casing, the insert body is prevented from being unexpectedly separated from the casing.

11. The device of claim 6, wherein the adjusting unit further comprises an illumination adjusting part individually adjusting at least one of the illumination of the ultraviolet lamp and a number of ultraviolet lamps to be turned on.

12. The device of claim 6, further comprising:
an opening provided at a lower end portion of the casing to discharge the electrocuted harmful insects in a downward direction of the casing; and
a holding part provided below the opening, and holding a receiving part collecting the electrocuted harmful insects.

13. An electric shock insecticidal device comprising:
a body unit including an ultraviolet lamp bar therein, the ultraviolet lamp bar having ultraviolet lamps;
a fixed electrode unit fixed to the body unit, and having electrodes spaced apart from each other at predetermined intervals; and
a movable electrode unit provided at a front or a rear of the fixed electrode unit, and having electrodes spaced apart from each other at intervals that are equal to or shorter than the intervals of the electrodes of the fixed electrode unit,
wherein the body unit includes an electrode position adjusting part adjusting the intervals between the electrodes of the fixed electrode unit and the electrodes of the movable electrode unit by moving the movable electrode unit in lateral directions of the fixed electrode unit.

14. The device of claim 13, wherein the ultraviolet lamps are ultraviolet LED lamps.

15. The device of claim 14, wherein the ultraviolet lamp bar comprises:
a first lamp part provided at a first surface of the ultraviolet lamp bar, the first lamp part having a plurality of ultraviolet LED lamps spaced apart from each other at predetermined intervals; and
a second lamp part provided at a second surface of the ultraviolet lamp bar, the second lamp part having a plurality of ultraviolet LED lamps, wherein a number of the ultraviolet LED lamps of the second lamp part is less than a number of the ultraviolet LED lamps of the first lamp part.

16. The device of claim 15, wherein the ultraviolet lamp bar comprises one or more ultraviolet lamp bars, and the ultraviolet lamp bars are individually controlled.

17. The device of claim 15, wherein at least one of the first lamp part and the second lamp part of the ultraviolet lamp bar is selectively turned on, and the first and second lamp parts are individually controlled.

18. The device of claim 15, wherein the ultraviolet lamp bar comprises an angle adjusting unit rotating the first lamp part and the second lamp part to adjust angles thereof, thereby changing directions thereof.

19. The device of claim 13, wherein voltages and currents applied to the fixed electrode unit and the movable electrode unit are controlled.

20. The device of claim 13, wherein the electrode position adjusting part comprises:
a rack provided at a lower end of the movable electrode unit; and
a pinion provided below the movable electrode unit and engaged with the rack.

21. The device of claim 13, wherein the electrode position adjusting part comprises:
a guide provided at least one of lower and upper ends of an inside of the body unit; and
a protrusion provided at at least one of lower and upper ends of the movable electrode unit, and engaged with the guide.

22. The device of claim 21, wherein the guide through which electric power flows provides the electric power to the electrodes of the movable electrode unit via the protrusion.

23. An electric shock insecticidal device comprising:
a body unit including an ultraviolet lamp bar therein, the ultraviolet lamp bar having ultraviolet lamps;
a fixed electrode unit fixed to the body unit, and having electrodes spaced apart from each other at predetermined intervals; and
a movable electrode unit provided at a front or a rear of the fixed electrode unit, and having electrodes spaced apart from each other at intervals that are equal to or shorter than the intervals of the electrodes of the fixed electrode unit,
wherein the body unit is provided with a mounting slit having two mounting positions, the mounting slit allowing adjustment of the mounting position of the movable electrode unit so as to adjust the intervals between the electrodes of the fixed electrode unit and the electrodes of the movable electrode unit.

24. The device of claim 23, wherein the ultraviolet lamps are ultraviolet LED lamps.

25. The device of claim 23, wherein voltages and currents applied to the fixed electrode unit and the movable electrode unit are controlled.

* * * * *